(12) United States Patent
Watanabe et al.

(10) Patent No.: US 7,222,032 B2
(45) Date of Patent: May 22, 2007

(54) LASER DIODE MANAGEMENT APPARATUS AND METHOD

(75) Inventors: Mitsuo Watanabe, Tokyo (JP); Isao Iwaguchi, Tokyo (JP); Hideo Miyazawa, Tokyo (JP); Kozo Yamazaki, Tokyo (JP); Masanori Ohkawa, Tokyo (JP)

(73) Assignees: Fujitsu Limited, Kawasaki (JP); Fujitsu Frontech Limited, Tokyo (JP)

( * ) Notice: Subject to any disclaimer, the term of this patent is extended or adjusted under 35 U.S.C. 154(b) by 0 days.

(21) Appl. No.: 10/745,610

(22) Filed: Dec. 29, 2003

(65) Prior Publication Data

US 2004/0167747 A1    Aug. 26, 2004

(30) Foreign Application Priority Data

Feb. 21, 2003    (JP)    ............................. 2003-044985

(51) Int. Cl.
*G01R 19/00*    (2006.01)
*G06F 11/30*    (2006.01)

(52) U.S. Cl. ........................................ 702/64; 702/184
(58) Field of Classification Search ............ 702/57–60, 702/64–65, 79, 81, 176, 178, 182, 184; 372/24, 372/29.01, 29.014, 34, 38.02
See application file for complete search history.

(56) References Cited

U.S. PATENT DOCUMENTS 4,792,956 A * 12/1988 Kamin ................... 372/29.021
5,163,063 A * 11/1992 Yoshikawa et al. ...... 372/38.02
5,936,986 A *  8/1999 Cantatore et al. ....... 372/38.02

FOREIGN PATENT DOCUMENTS

JP    2001-92920    4/2001

* cited by examiner

*Primary Examiner*—Bryan Bui
(74) *Attorney, Agent, or Firm*—Armstrong, Kratz, Quintos, Hanson & Brooks, LLP.

(57) ABSTRACT

A time for replacement of a laser diode is decided based on a value of operating current of the laser diode and a value of intensity of laser light output from the laser diode.

10 Claims, 6 Drawing Sheets

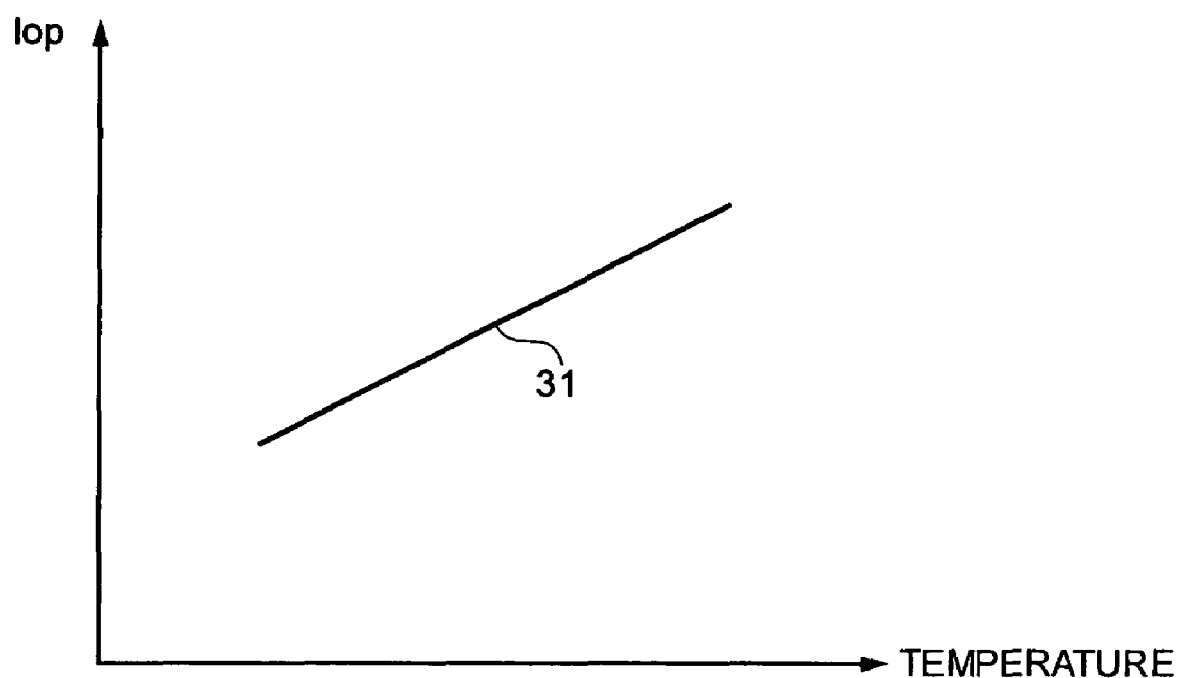

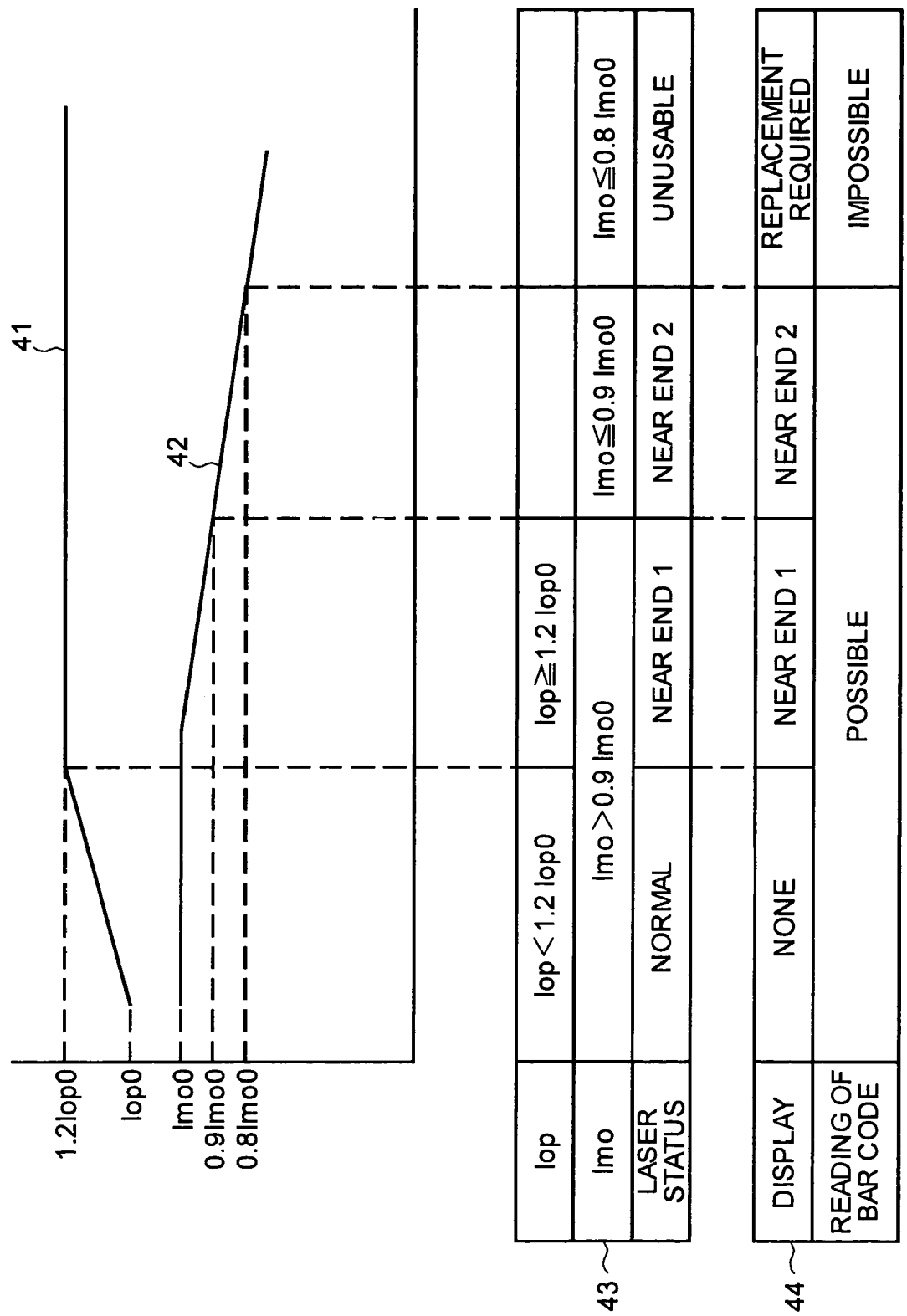

FIG.5A

| | SPEAKER | SOUND --------- SOUNDLESS ------- 0  70(ms) ⊓ |
|---|---|---|
| READ SUCCESSFULLY | LED | GREEN LED: ON ------ GREEN LED: OFF ---- 0  100(ms) ⊓ |
| | 7SEG Display | (NON-DISPLAY) |

FIG.5B

| | SPEAKER | SOUND --------- SOUNDLESS ------- |
|---|---|---|
| NEAR END 1 | LED | GREEN LED: ON ------ GREEN LED: OFF ---- 0 1 2 3 4 5 6 7 8 9 (s) ⊓__⎯⎯⎯⎯⌐REPEATED |
| | 7SEG Display | (LdEnd-1) |

FIG.5C

| | SPEAKER | SOUND --------- SOUNDLESS ------- |
|---|---|---|
| NEAR END 2 | LED | GREEN LED: ON ------ GREEN LED: OFF ---- 0 1 2 3 4 5 6 7 8 9 (s) ⊓⎯⌐REPEATED |
| | 7SEG Display | (LdEnd-2) |

FIG.5D

| | SPEAKER | SOUND --------- SOUNDLESS ------- |
|---|---|---|
| REPLACEMENT REQUIRED | LED | GREEN LED: ON ------ GREEN LED: OFF ---- YELLOW LED: ON ------ YELLOW LED: OFF ---- 0 1 2 3 4 (s) ⌐REPEATED |
| | 7SEG Display | (LASAr) |

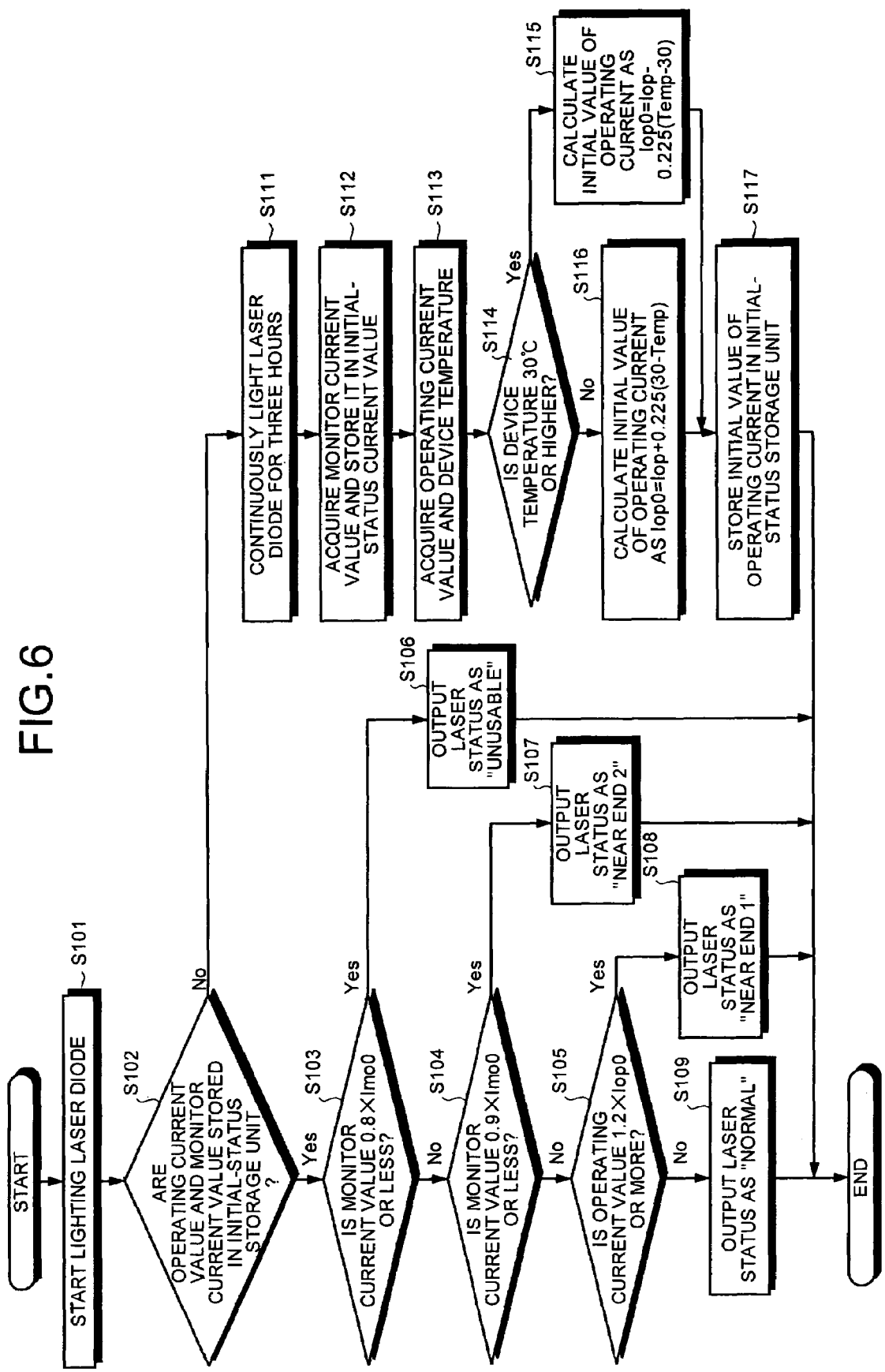

LASER DIODE MANAGEMENT APPARATUS AND METHOD

BACKGROUND OF THE INVENTION

1. Field of the Invention

The present invention relates to management of when to replace a laser diode that has become weak.

2. Description of the Related Art

Laser diodes are used in optical communications and optical systems such bar-code readers. The laser diodes are small and they produce considerable laser output at low cost. However, the output of a laser diode decays with aging. In that case, it is the time to replace the laser diode with a new one.

Japanese Patent Application Laid Open No. 2001-092920 discloses a technology to determine when to replace the laser diode. Precisely, output of the laser diode is monitored and if the output is less than a specific value, it is determined that the laser diode should be replaced. However, according to this configuration, it is possible to determine when to replace the laser-diode only when the laser diode has become weak. Moreover, device can not be used from when it is determined that the laser diode needs replacement until the laser diode is replaced with a new one.

However, decay of the output of the laser diode is not only due to the aging of the laser diode. The output of the laser diode may also decay due to failure of a driving circuit that drives the laser diode. However, with the known technology, it is possible to decide whether the output of the laser diode has decayed due to the aging of the laser diode or failure of the driving circuit.

SUMMARY OF THE INVENTION

It is an object of the present invention to solve at least the problems in the conventional technology.

A laser diode management apparatus according to one aspect of the present invention decides a time to replace a laser diode. This laser diode management apparatus includes an operating-current value acquiring unit that acquires a value of an operating current of the laser diode; a laser intensity acquiring unit that acquires a value of intensity of laser light output from the laser diode; and a replacement period determining unit that determines a replacement period of the laser diode based on the value of the operating current and the values intensity of the laser light, and outputs at least one of a first notification that indicates that the laser diode needs replacement and a second notification that indicates that the laser diode needs replacement in near future, based on a result of the determination.

A method of management of a time to replace a laser diode according to another aspect of the present invention includes acquiring a value of an operating current of the laser diode; acquiring a value of intensity of laser light output from the laser diode; and determining when the laser diode need replacement based on the value of the operating current and the values intensity of the laser light acquired.

The other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 3 illustrates temperature characteristic of the laser diode;

FIG. 4 is a diagram for explaining how the laser diode management unit determines the status of the laser diode;

FIG. 5A to FIG. 5D are examples of display; and

FIG. 6 is a flowchart of processing operation of the laser diode management unit.

DETAILED DESCRIPTION

Exemplary embodiments of the laser diode management apparatus according to the present invention, in particular of a bar-code scanner including the laser diode management apparatus are explained in detail below with reference to the accompanying drawings.

Figure 1:
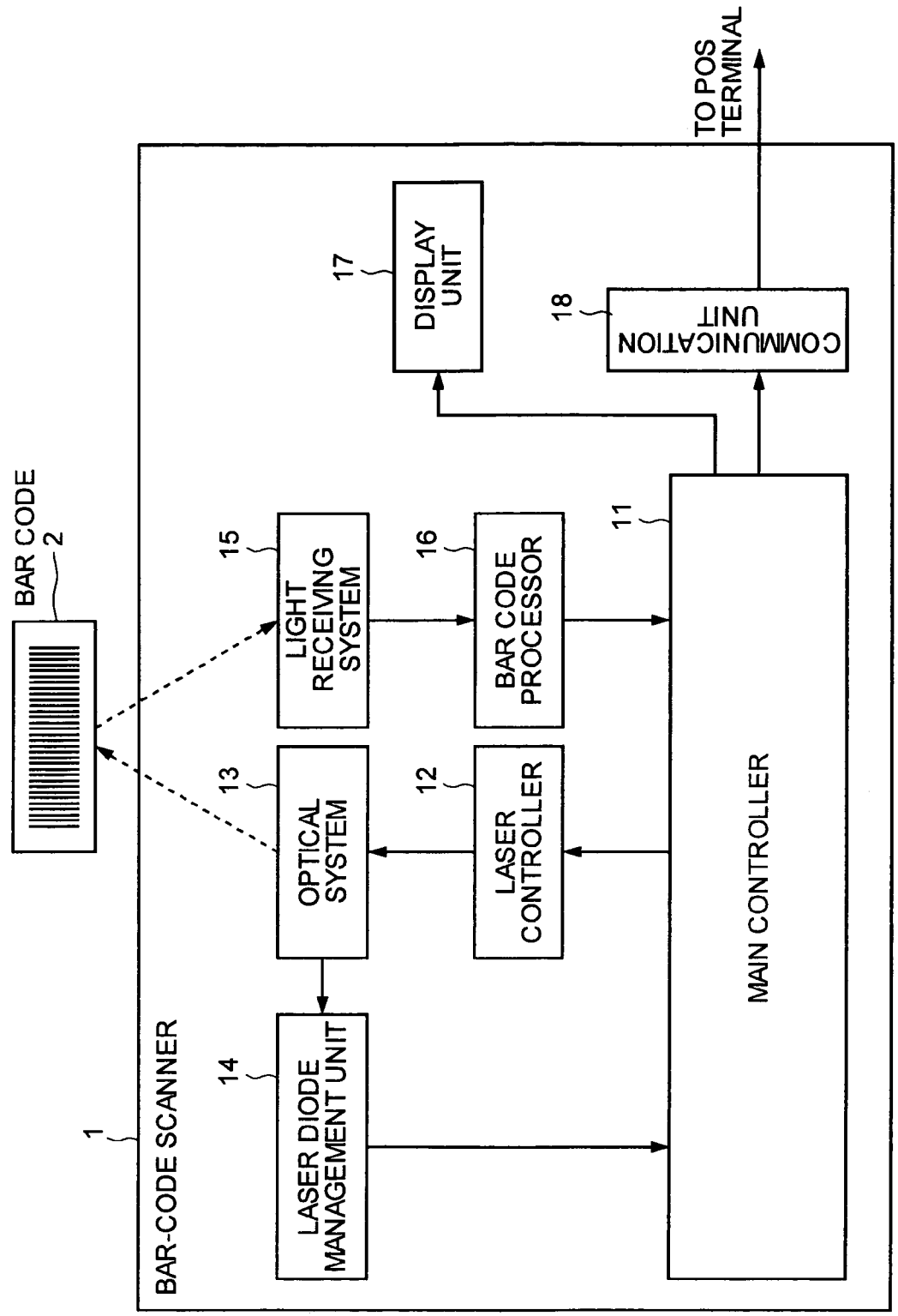
FIG. 1 is a block diagram of a bar-code scanner according to an embodiment of the present invention.

FIG. 1 is a block diagram of the schematic configuration of the bar-code scanner according to an embodiment of the present invention. A bar-code scanner 1 includes a main controller 11, a laser controller 12, an optical system 13, a laser diode management unit 14, a light receiving system 15, a bar code processor 16, a display unit 17, and a communication unit 18.

The main controller 11 controls the whole of the bar-code scanner 1. When the bar-code scanner 1 is to read a bar code 2, the main controller 11 scans the bar code 2 using a laser controller 12, receives character data from the bar code processor 16, and transmits the data to a point-to-sale (POS) terminal through the communication unit 18.

The laser controller 12 makes the optical system 13 operate and scan the bar code 2 under the control of the main controller 11. More specifically, the optical system 13 includes a laser diode and a polygon motor, and scans the bar code 2 by making the polygon motor move a radiation position of laser light output from the laser diode.

The optical system 13 is connected with the laser diode management unit 14. The laser diode management unit 14 determines a status of the laser diode based on an operating current of the laser diode, an output of the laser light, and a temperature near the laser diode, and outputs a result of determination to the main controller 11.

On the other hand, the laser light reflected by the bar code 2 is converted to an electrical signal by a photodiode disposed inside the light receiving system 15, and the electrical signal is output to the bar code processor 16. The bar code processor 16 decodes the electrical signal to the laser light to generate character data as a string of numeral and character, and transmits the character data to the main controller 11.

When receiving the character data from the bar code processor 16, the main controller 11 displays a notification indicating that reading of the bar code is successfully finished on the display unit 17, and transmits the character data to the POS terminal via the communication unit 18.

The display unit 17 has a light emitting diode (LED), a speaker, and a seven segment display. The display unit 17 can notify an error message or the like other than the notification.

Figure 2:
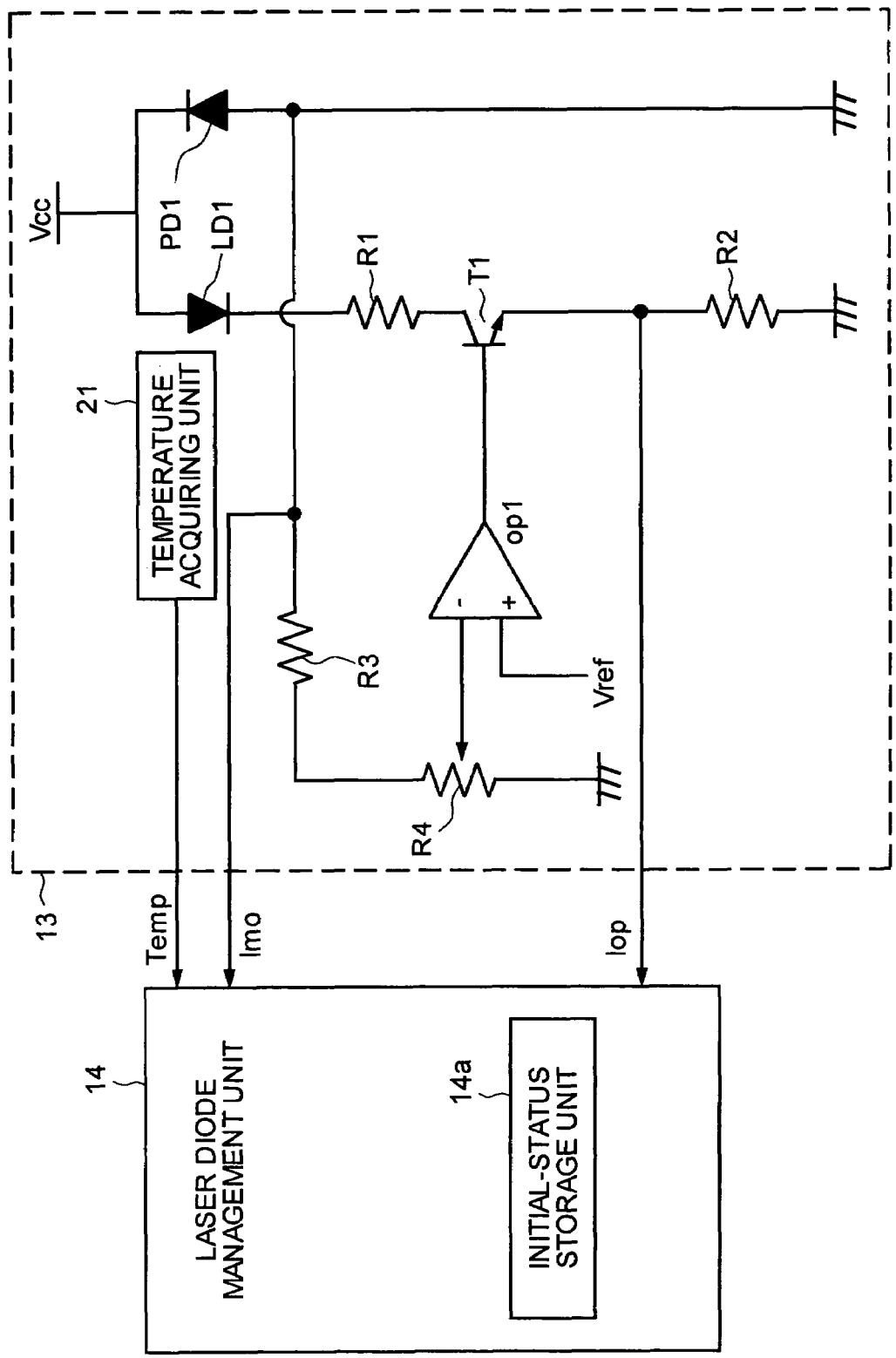
FIG. 2 is a detailed block diagram of an optical system and a laser diode management unit that are illustrated in FIG. 1.

The configuration of the optical system 13 and the laser diode management unit 14 is explained in further detail below. FIG. 2 is a block diagram of the schematic configuration of the optical system 13 and the laser diode management unit 14. The optical system 13 includes a laser diode LD1, a photodiode PD1, resisters R1 to R4, a transistor T1, an operational amplifier OP1, and a temperature acquiring unit 21. It is noted that only the configuration related to the output of the laser light is explained below by referring to FIG. 2, and explanation of components used to change the radiation position of the polygon motor is omitted.

As shown in FIG. 2, the laser diode LD1 is supplied with a potential Vcc to emit laser light by a switching operation with the transistor T1. The photodiode PD1 receives the laser light from the laser diode LD1, converts an intensity thereof to an electrical signal, and outputs the electrical signal. Therefore, a current value Imo of the electrical signal represents the intensity of the laser light, and the electrical signal functions as a monitor current used to monitor the intensity of the laser light.

The monitor current is input to the operational amplifier OP1 through the resistor R3 and resistor R4. The operational amplifier OP1 performs switching control on the transistor T1 based on a result of comparison between the voltage of the monitor current and a potential Vref to adjust the intensity of the laser light to a prescribed value.

The laser diode management unit 14 acquires, from the optical system 13, an, operating current value Iop as a value of operating current flowing in the laser diode LD1, a value of the monitor current Imo output from the photodiode PD1, and a device temperature Temp of the laser diode LD1 output from the temperature acquiring, unit 21. The laser diode management unit 14 then determines a status of the laser diode LD1 using the operating current value Iop, monitor current value Imo, and device temperature Temp.

The reason to acquire the temperature of the laser diode LD1 is because the temperature characteristic of the laser diode is corrected. FIG. 3 is a diagram of the temperature characteristic of the laser diode. When the temperature of the laser diode is high, an operating current required to obtain constant output becomes high. More specifically, referring to a temperature characteristic 31, the required operating current increases by 0.225A each time the device temperature of the laser diode rises by 1° C.

The laser diode management unit 14 stores a monitor current value Imo0 and an operating current value Iop0 in an initial status of a laser device, in an initial-status storage unit 14a. The laser diode management unit 14 compares the monitor current value Imo0 and the operating current value Iop0 in the initial state with the monitor current value Imo and the operating current value Iop acquired from the optical system 13 to determine the status of the laser diode LD1.

The determination performed by the laser diode management unit 14 is explained in detail below with reference to FIG. 4. Operating current progression 41 indicates the progression of operating current values Iop over time, and monitor current progression 42 indicates the progression of monitor current values Imo over time. An operation table 43 represents the operation of the laser diode management unit 14, and an operation table 44 represents the operation of the main controller 11.

As shown in the operating current progression 41, the operating current value Iop increases with time. This is because a current required to obtain the same intensity of laser output is increased because of degradation of the laser diode LD1. On the other hand, the value of the current that can be supplied to the laser diode LD1 has an upper limit to the drive circuit.

Therefore, the operating current value Iop gradually increases and the monitor current value Imo becomes constant in a range in which a current value required to obtain a prescribed output can be supplied. However, after the operating current value Iop reaches the limit, the operating current value Iop becomes constant and the monitor current value Imo gradually decreases.

As shown in the operation table 43, the laser diode management unit 14 compares the operating current value Iop with the operating current value Iop0 in the initial status (hereinafter, "initial-status operating current value Iop0"). If the operating current value Iop is smaller as compared with 1.2 times the initial-status operating current value Iop0, the status of the laser diode LD1 is determined as "normal". If the operating current value Iop becomes not less than 1.2 times the initial-status operating current value Iop0, the status of the laser diode LD1 is determined as "near end 1". When the operating current values are to be compared with each other, the device temperature acquired by the temperature acquiring unit 21 is used to previously correct the operating current values as necessary.

The term "near end" indicates a status in which the laser diode can be still used although it is being degraded and approaching the end of its life. As explained above, the notification "near end" makes it possible to notify the user of the end of its life before the end. A plurality of stages corresponding to a period until the end of its life is provided for the advance notification, which makes it possible to notify the user of a detailed status of the laser diode. The laser diode management unit 14 sets the near end to two stages, and the "near end 1" is an advance notification as an initial stage.

Furthermore, the laser diode management unit 14 compares the monitor current value Imo with the monitor current value Imo0 in the initial status (hereinafter, "initial-status monitor current value Imo0"). If the monitor current value Imo becomes not more than 0.9 times the initial-status monitor current value Imo0, the status of the laser diode LD1 is determined as "near end 2". The "near end 2" is another advance notification as a second stage.

If the monitor current value Imo becomes not more than 0.8 times the initial status monitor current value Imo0, then the laser diode management unit 14 determines the status of the laser diode LD1 as "unusable".

On the other hand, as shown in the operation table 44; if the output of the laser diode management unit 14 is "normal", then the main controller 11 executes reading of the bar code without a display related to the status of the laser diode on the display unit 17. If the output of the laser diode management unit 14 is "near end 1", then the main controller 11 performs a display corresponding to "near end 1" on the display unit 17, and executes reading of the bar code.

Likewise, if the output of the laser diode management unit 14 is "near end 2", then the main controller 11 performs a display corresponding to "near end 2" on the display unit 17, and executes reading of the bar code. If the output of the laser diode management unit 14 is "unusable", then the main controller 11 notifies the user of requiring replacement of the laser diode on the display unit 17. At this time, the main controller 11 stops reading the bar code.

The displays using the display unit 17 are explained in detail below with reference to FIG. 5A to FIG. 5D. FIG. 5A is a diagram of the output of the display unit 17 when the bar code is successfully read. FIG. 5B is a diagram of the output thereof corresponding to "near end 1", and FIG. 5C is a diagram of the output thereof corresponding to "near end 2". Further, FIG. 5D is a diagram of the output thereof indicating "replacement required".

More specifically, when the bar code is successfully read, the display unit 17 outputs a signal sound for 70 milliseconds from the speaker, and lights a green LED for 100 milliseconds. In this case, the seven segment display is not used for the display.

When the status of the laser diode LD1 is "near end 1", the display unit 17 does not allow the speaker to produce a sound, but lights the green LED by 1 second at 3-second intervals. At this time, "LdEnd-1" is displayed on the seven segment display.

Likewise, when the status of the laser diode LD1 is "near end 2", the display unit 17 does not allow the speaker to produce a sound, but lights the green LED by 1 second at 2-second intervals. At this time, "LdEnd-2" is displayed on the seven segment display.

Furthermore, when the replacement of the laser diode LD1 is required, the display unit 17 does not allow the speaker to produce a sound, but lights the green LED by 0.5 second at 0.5-second intervals, and lights a yellow LED by 0.5 second at 3-second intervals. At this time, "LASAr" is displayed on the seven segment display.

FIG. 6 is a flowchart of the processing operation of the laser diode management unit 14. If the laser diode LD1 is lit (step S101), the management unit 14 determines whether the operating current value Iop0 and the monitor current value Imo0 are stored in the initial-status storage unit 14a (step S102).

If the operating current value Iop0 and the monitor current value Imo0 are not stored therein (No at step S102), then the management unit 14 continuously lights the laser diode LD1 for three hours (step S111). The reason that the laser diode LD1 is continuously lit is because the operation of the laser diode LD1 is made stable prior to acquisition of an operating current and a monitor current.

After the processing at step S111 is finished, the management unit 14 acquires a value of the monitor current and stores the value as an initial-status monitor current value Imo0 in the initial-status storage unit 14a (step S112). Thereafter, the management unit 14 acquires a value of the operating current and a value of a device temperature (step S113), and determines whether the value of the device temperature Temp is not less than 30° C. (step S114).

If the value of the device temperature Temp is not less than 30° C. (Yes at step S114), then the management unit 14 calculates the initial-status operating current value Iop0 as Iop0=Iop−0.225 (Temp −30) (step S115). On the other hand, if the value of the device temperature Temp is less than 30° C. (No at step S114), then the management unit 14 calculates the initial-status operating current value Iop0 as Iop0=Iop+0.225 (30−Temp) (step S116).

After the step S115 or step S116 is finished, the management unit 14 stores the calculated operating current value Iop0 in the initial-status storage unit 14a, and ends the processing.

If the operating current value Iop0 and the monitor current value Imo0 are stored in the initial-status storage unit 14a (Yes at step S102), then the management unit 14 compares the monitor current value Imo with the initial-status monitor current value Imo0.

In this comparison, the management unit 14 determines whether the monitor current value Imo decreases by 20% or more as compared with the initial-status monitor current value Imo0 (step S103). If the monitor current value Imo decreases by 20% or more (Yes at step S103), the management unit 14 outputs the status of the laser diode LD1 as "unusable", and ends the processing.

On the other hand, if the monitor current value Imo is greater than 0.8 times the initial-status monitor current value Imo0 (No at step S103), then the management unit 14 determines whether the monitor current value Imo decreases by 10% or more as compared with the initial-status monitor current value Imo0 (step S104). If the monitor current value Imo decreases by 10% or more (Yes at step S104), then the management unit 14 outputs the status of the laser diode as "near end 2", and ends the processing.

If the monitor current value Imo is greater than 0.9 times the initial-status monitor current value Imo0 (No at step S104), then the management unit 14 compares the operating current value Iop with the initial-status operating current value Iop0 (step S105). Here, the value of the operating current value Iop is corrected in advance with the device temperature in the same manner as the initial-status operating current value Iop0.

If the corrected operating current value Iop is not less than 1.2 times the initial-status operating current value Iop0 (Yes at step S105), then the management unit 14 outputs the status of the laser diode as "near end 1", and ends the processing. On the other hand, if the corrected operating current value Iop is less than 1.2 times the initial-status operating current value Iop0 (No at step S105), then the management unit 14 outputs the status of the laser diode as "normal", and ends the processing.

As explained above, the laser diode management unit 14 stores the operating current and monitor current in the initial status of the laser diode LD1, and determines the status of the laser diode LD1 based on the changes in the values of the operating current and the monitor current. Therefore, it is possible to detect the replacement period of the laser diode LD1 before it becomes unusable. Further, by using the monitor current and the operating current, it is possible to discriminate a decrease in output due to failure of the drive circuit from a decrease in output due to degradation of the laser diode.

Furthermore, when the status of the laser diode LD1 is determined, a plurality of notifications, i.e., "near end 1" and "near end 2" corresponding to time stages up to the replacement period are properly used. Therefore, a further detailed status of the laser diode can be notified. For example, when the status of the laser diode is "near end 1", the user makes arrangements for a laser diode used for replacement, and when the status is "near end 2", the user replaces the laser diode with a new one during some interval of operations. It is thereby possible to carry out laser diode replacement before it becomes unusable.

In the embodiment, the status of the laser diode is divided into "normal", "near end 1", "near end 2", and "unusable", but the present invention is not limited to the divisions, and it may be divided into any number of stages.

In the embodiment, the management of the laser diode mounted on the bar-code scanner is explained, but applicability of the present invention is not limited to the bar-code scanner. That is, the present invention is applicable to any device using the laser diode.

As explained above, according to the present invention, the time of replacement of the laser diode is determined based on a value of an operating current of the laser diode and an intensity of laser light output from the laser diode. Therefore, it is possible to decide when to replace the laser diode before the output of the laser diode has really decayed. Moreover, the time of replacement of the laser diode can be promptly and effectively notified to the users. Furthermore, it is possible to correct a change in the operating current due to temperature characteristic of the laser diode and accurately decide the replacement period.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A laser diode management apparatus that decides a time to replace a laser diode, comprising:
   an operating-current value acquiring unit that acquires a value of an operating current of the laser diode;
   a laser intensity acquiring unit that acquires a value of intensity of laser light output from the laser diode; and
   a replacement period determining unit that determines a replacement period of the laser diode based on the value of the operating current, the value of intensity of the laser light, and temperature of the laser diode, and outputs at least one of a first notification that indicates that the laser diode needs replacement and a second notification that indicates that the laser diode needs replacement in near future, based on a result of the determination.

2. The laser diode management apparatus according to claim 1, wherein the replacement period determining unit outputs a plurality of the second notification at a predetermined time interval.

3. The laser diode management apparatus according to claim 1, wherein the replacement period determining unit makes comparison of the value of the operating current with a current threshold and the value of the intensity of the laser light with an intensity threshold and makes determination about the replacement period of the laser diode based on the comparison.

4. The laser diode management apparatus according to claim 3, wherein the replacement period determining unit outputs the second notification when the value of the operating current is equal to or greater than the current threshold.

5. The laser diode management apparatus according to claim 3, wherein the replacement period determining unit outputs the second notification when the value of intensity of the laser light is equal to or less than the intensity threshold.

6. The laser diode management apparatus according to claim 3, wherein the replacement period determining unit outputs the first notification when the value of intensity of the laser light is equal to or less than the intensity threshold.

7. A laser diode management apparatus that decides a time to replace a laser diode, comprising: operating-current value acquiring unit that acquires a value of an operating current of the laser diode;
   a laser intensity acquiring unit that acquires a value of intensity of laser light output from the laser diode; and
   a replacement period determining unit that determines a replacement period of the laser diode based on the value of the operating current, the value of intensity of the laser light, and temperature of the laser diode, and outputs at least one of a first notification that indicates that the laser diode needs replacement and a second notification that indicates that the laser diode needs replacement in near future, based on a result of the determination, wherein the replacement period determining unit makes comparison of the value of the operating current with a current threshold and the value of the intensity of the laser light with an intensity threshold and makes determination about the replacement period of the laser diode based on the comparison, and the laser diode management apparatus further comprises:
   an initial-status storage unit that stores a value of the operating current and an intensity of the laser light in an initial status of the laser diode, wherein the current threshold is calculated from the value of the operating current and the intensity threshold is calculated from the value of intensity of the laser light stored in the initial-status storage unit.

8. The laser diode management apparatus according to claim 7, wherein the value of the operating current and the value of intensity of the laser light stored in the initial-status storage unit are equal to a value of the operating current and an intensity of the laser light respectively obtained after the laser diode is continuously emitted for a prescribed time.

9. The laser diode management apparatus according to claim 1, further comprising a temperature measuring unit that measures temperature of the laser diode, wherein the replacement period determining unit corrects the value of the operating current acquired by the operating-current value acquiring unit based on the temperature measured by the temperature measuring unit.

10. A method of management of a time to replace a laser diode, comprising:
    acquiring a value of an operating current of the laser diode; measuring a temperature of the laser diode:
    acquiring a value of intensity of laser light output from the laser diode; and
    determining when the laser diode need replacement based on the value of the operating current, the value of intensity of the laser light acquired, and the temperature of the laser diode, and outputting at least one of a first notification that indicates that the laser diode needs replacement and a second notification that indicates that the laser diode needs replacement in near future, based on a result of the determining.

* * * * *